(12) United States Patent
Prasad et al.

(10) Patent No.: US 10,643,710 B2
(45) Date of Patent: May 5, 2020

(54) ENHANCED ERASE RETRY OF NON-VOLATILE STORAGE DEVICE

(71) Applicant: Western Digital Technologies, Inc., San Jose, CA (US)

(72) Inventors: Divya Prasad, East Delhi (IN); Sainath Viswasarai, Hyderabad (IN); Gopu S, Trivandrum (IN); Swaroop Kaza, Campbell, CA (US); Piyush Anil Dhotre, Bengaluru (IN); Chittoor Devarajan Sunilkumar, Bengaluru (IN)

(73) Assignee: WESTERN DIGITAL TECHNOLOGIES, INC., San Jose, CA (US)

(*) Notice: Subject to any disclaimer, the term of this patent is extended or adjusted under 35 U.S.C. 154(b) by 27 days.

(21) Appl. No.: 15/828,421

(22) Filed: Nov. 30, 2017

(65) Prior Publication Data

US 2019/0164614 A1 May 30, 2019

(51) Int. Cl.

| | |
|---|---|
| *G11C 16/04* | (2006.01) |
| *G11C 16/16* | (2006.01) |
| *G11C 16/34* | (2006.01) |
| *G06F 12/02* | (2006.01) |
| *G11C 16/12* | (2006.01) |

(52) U.S. Cl.
CPC .......... *G11C 16/16* (2013.01); *G06F 12/0246* (2013.01); *G11C 16/0483* (2013.01); *G11C 16/12* (2013.01); *G11C 16/3409* (2013.01); *G11C 16/3445* (2013.01)

(58) Field of Classification Search
CPC ..... G11C 16/16; G11C 16/0483; G11C 16/12; G11C 16/30409; G11C 16/3445
USPC .......................... 365/185.29, 185.24, 185.22
See application file for complete search history.

(56) References Cited

U.S. PATENT DOCUMENTS

| | | | |
|---|---|---|---|
| 2011/0216592 A1 | 9/2011 | Nagashima | |
| 2012/0206976 A1* | 8/2012 | Aoki | G11C 16/0483 365/185.22 |
| 2012/0269001 A1* | 10/2012 | Ueno | G11C 16/16 365/185.22 |
| 2012/0275232 A1* | 11/2012 | Park | G11C 16/0483 365/185.19 |
| 2019/0130982 A1* | 5/2019 | Reusswig | G06F 11/1012 |

\* cited by examiner

*Primary Examiner* — Connie C Yoha
(74) *Attorney, Agent, or Firm* — Kunzler Bean & Adamson, PC

(57) ABSTRACT

Apparatuses, systems, methods, and computer program products for enhanced erase retry of a non-volatile storage device are disclosed. An apparatus includes a non-volatile storage device and a controller. A controller includes a verification component configured to detect that an erase operation performed on an erase block of a non-volatile storage device is unsuccessful. A controller includes a parameter component configured to adjust one or more erase parameters for an erase operation. One or more erase parameters may be associated with one or more select gate drain storage cells of an erase block. A controller includes an erase component configured to retry an erase operation on an erase block with one or more adjusted erase parameters.

20 Claims, 8 Drawing Sheets

ENHANCED ERASE RETRY OF NON-VOLATILE STORAGE DEVICE

TECHNICAL FIELD

The present disclosure, in various embodiments, relates to computer storage devices and more particularly relates to adjusting configuration settings for erase retry operations.

BACKGROUND

Erasing an erase block under certain conditions, e.g., certain temperatures, may not pass erase verification due to problems with certain storage cells of the erase block, even though the erase block is still good. Conventional methods simply retry the erase operation on the erase block without changing any parameters to see if it passes verification a second time, and if not, the erase block is marked as bad and retired.

SUMMARY

Various embodiments include apparatuses, systems, methods, and computer program products for enhanced erase retry of a non-volatile storage device are disclosed. In one embodiment, an apparatus includes a non-volatile storage device and a controller. A controller, in some embodiments, includes a verification component configured to detect that an erase operation performed on an erase block of a non-volatile storage device is unsuccessful. A controller, in further embodiments, includes a parameter component configured to adjust one or more erase parameters for an erase operation. One or more erase parameters may be associated with one or more select gate drain storage cells of an erase block. A controller, in certain embodiments, includes an erase component configured to retry an erase operation on an erase block with one or more adjusted erase parameters.

An apparatus, in various embodiments, includes means for performing an erase operation on an erase block of a non-volatile storage medium. An erase block may include one or more select gate drain storage elements. An apparatus, in further embodiments, includes means for determining that an erase operation performed on an erase block failed. In various embodiments, an apparatus includes means for modifying one or more settings for one or more select gate drain storage elements. One or more settings may include a voltage setting for one or more select gate drain storage elements. In some embodiments, an apparatus includes means for retrying an erase operation on an erase block based on one or more modified settings for one or more select gate drain storage elements.

A system, in one embodiment, includes a non-volatile memory device comprising a three-dimensional NAND flash device having a plurality of erase blocks, and a controller for the non-volatile memory device. In certain embodiments, a controller performs operations for configuring one or more parameters of select gate drain storage elements of an erase block of a non-volatile memory device in response to an erase operation failing. One or more parameters may include an erase bit ignore parameter. An erase bit ignore parameter may define an acceptable bit failure threshold for an erase block. In various embodiments, a controller performs operations for retrying an erase operation on an erase block using one or more configured parameters of select gate drain storage elements. In one embodiment, a controller performs operations for verifying that an erase operation that is performed on an erase block using one or more configured parameters of select gate drain storage elements successfully passed.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
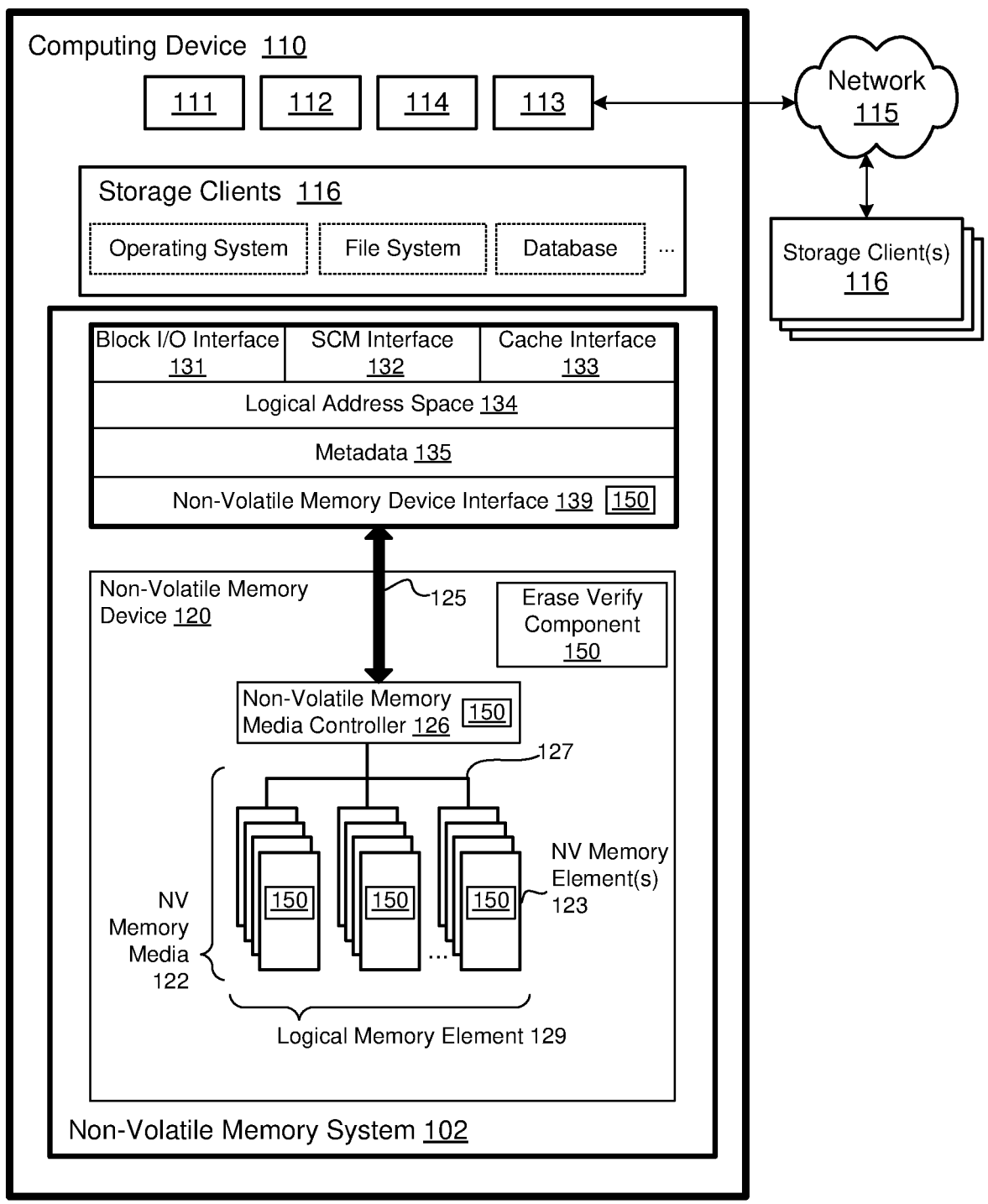
FIG. 1A is a schematic block diagram illustrating one embodiment of a system for enhanced erase retry of non-volatile storage device.

Aspects of the present disclosure may be embodied as an apparatus, system, method, or computer program product. Accordingly, aspects of the present disclosure may take the form of an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodiment on one or more non-transitory computer-readable storage media storing computer-readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions that may, for instance, be organized as an object, procedure, or function. Nevertheless, the executables of an identified module need not be physically located together, but may comprise disparate instructions stored in different locations that, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer-readable and/or executable storage media. Any combination of one or more computer-readable storage media may be utilized. A computer-readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer-readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

In addition, as used herein, the term "set" can mean "one or more," unless expressly specified otherwise. The term "sets" can mean multiples of or a plurality of "one or mores," "ones or more," and/or "ones or mores" consistent with set theory, unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 including an erase verify component 150 for a controller 126 of a non-volatile memory device 120. The erase verify component 150 may be part of and/or in communication with a controller 126, a non-volatile memory element 123, a device driver, or the like. The erase verify component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer-readable storage medium 114. The computer-readable storage medium 114 may comprise executable instructions configured to cause the computing device 110 (e.g., processor 111) to perform steps of one or more of the methods disclosed herein. Alternatively, or in addition, the erase verify component 150 may be embodied as one or more computer-readable instructions stored on the non-transitory storage medium 114.

The non-volatile memory system 102, in the depicted embodiment, includes an erase verify component 150. The erase verify component 150, in one embodiment, is configured to enhance an erase retry operation of a non-volatile memory device 120. In certain embodiments, the erase verify component 150 detects that an erase operation that is performed on an erase block of a non-volatile memory device 120 is unsuccessful, adjusts one or more erase parameters associated with one or more select gate drain storage cells of the erase block, and retries the erase operation on the erase block with the one or more adjusted erase operations.

In one embodiment, the erase verify component 150 may comprise logic hardware of one or more non-volatile memory devices 120, such as a controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the erase verify component 150 may comprise executable software code, such as a device driver or the like, stored on the computer-readable storage medium 114 for execution on the processor 111. In a further embodiment, the erase verify component 150 may include a combination of both executable software code and logic hardware.

In one embodiment, the erase verify component 150 is configured to receive I/O requests from a device driver or other executable application via a bus 125 or the like. The erase verify component 150 may be further configured to transfer data to/from a device driver and/or storage clients 116 via the bus 125. Accordingly, the erase verify component 150, in some embodiments, may comprise and/or be in communication with one or more direct memory access (DMA) modules, remote DMA modules, bus controllers, bridges, buffers, and so on to facilitate the transfer of memory/storage requests and storage operations of associated program data. In another embodiment, the erase verify component 150 may receive storage requests as an API call from a storage client 116, as an IO-CTL command, or the like.

According to various embodiments, a controller 126 in communication with one or more erase verify components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more memory elements 123 of non-volatile memory media 122, which may include, but is not limited to: random access memory (RAM), resistive RAM (ReRAM), Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape, etc.), optical storage media, and/or the like, among other devices that are possible and contemplated herein. The one or more memory elements 123 of non-volatile memory media 122, in certain embodiments, comprise storage class memory (SCM).

While legacy technologies, such as NAND flash, may be block and/or page addressable, storage class memory, in one embodiment, is byte addressable. In further embodiments, SCM may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, and/or the like. Further, the non-volatile memory device 120, in various embodiments, may comprise a non-volatile recording device, a non-volatile memory device, a non-volatile storage device, and/or the like.

The non-volatile memory media 122 may comprise one or more non-volatile memory elements 123, which may include, but are not limited to: chips, packages, planes, die, and/or the like. A controller 126 may be configured to manage data operations on the non-volatile memory media 122, and may comprise one or more processors, programmable processors (e.g., FPGAs), ASICs, micro-controllers, or the like. In some embodiments, the controller 126 is configured to store data on and/or read data from the non-volatile memory media 122, to transfer data to/from the non-volatile memory device 120, and so on.

The controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, ... WLN).

The controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library.

A device driver may be further configured to provide a cache interface 133 for caching data using the non-volatile memory system 102. A device driver may further comprise a non-volatile memory device interface 139 that is configured to transfer data, commands, and/or queries to the controller 126 over a bus 125, as described above.

Figure 1B:
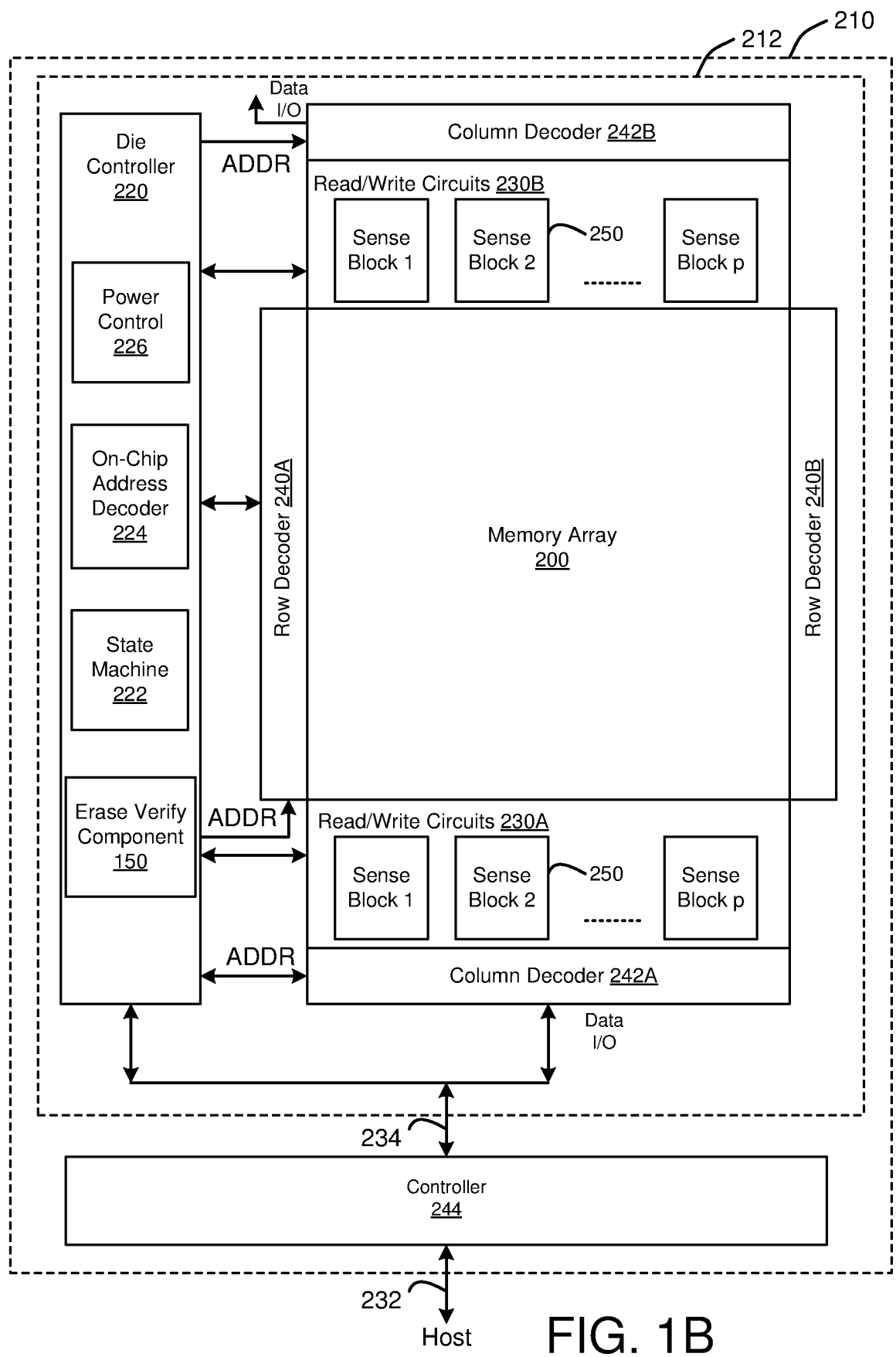
FIG. 1B is a schematic block diagram illustrating another embodiment of a system for enhanced erase retry of non-volatile storage device.

FIG. 1B illustrates an embodiment of a non-volatile storage device 210 that may include one or more memory die and/or chips 212. Memory die 212, in some embodiments, includes an array (e.g., two-dimensional (2D), three dimensional (3D), etc.) of memory cells 200, die controller 220, and read/write circuits 230A/230B. In one embodiment, access to the memory array 200 by various peripheral circuits is implemented in a symmetric fashion, on opposite sides of the array, so that the densities of access lines and circuitry on each side are reduced by half. The read/write circuits 230A/230B, in a further embodiment, can include multiple sense blocks 250 that allow a page of memory cells to be read and/or programmed in parallel.

The memory array 200, in various embodiments, is addressable using word lines via row decoders 240A/240B and using bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes an erase verify component 150, a state machine 222, and an on-chip address decoder 224. In one embodiment, the state machine 222 comprises at least a portion of the erase verify component 150. In a further embodiment, the controller 244 comprises at least a portion of the erase verify component 150. In various embodiments, one or more of the sense blocks 250 comprises at least a portion of the erase verify component 150. The erase verify component(s) 150 discussed with reference to FIG. 1B may be similar to the erase verify component(s) 150 discussed with reference to FIG. 1A.

The state machine 222, in one embodiment, provides chip-level control of memory operations. The on-chip address decoder 224 provides an address interface to convert between the address that is used by the host or a memory controller to the hardware address used by the decoders 240A, 240B, 242A, and 242B. In certain embodiments, the state machine 222 includes an embodiment of the erase verify component 150. The erase verify component 150, in certain embodiments, is embodied as software in a device driver, hardware in a controller 244, and/or hardware in a die controller 220 and/or state machine 222. In one embodiment, one or any combination of die controller 220, erase verify component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
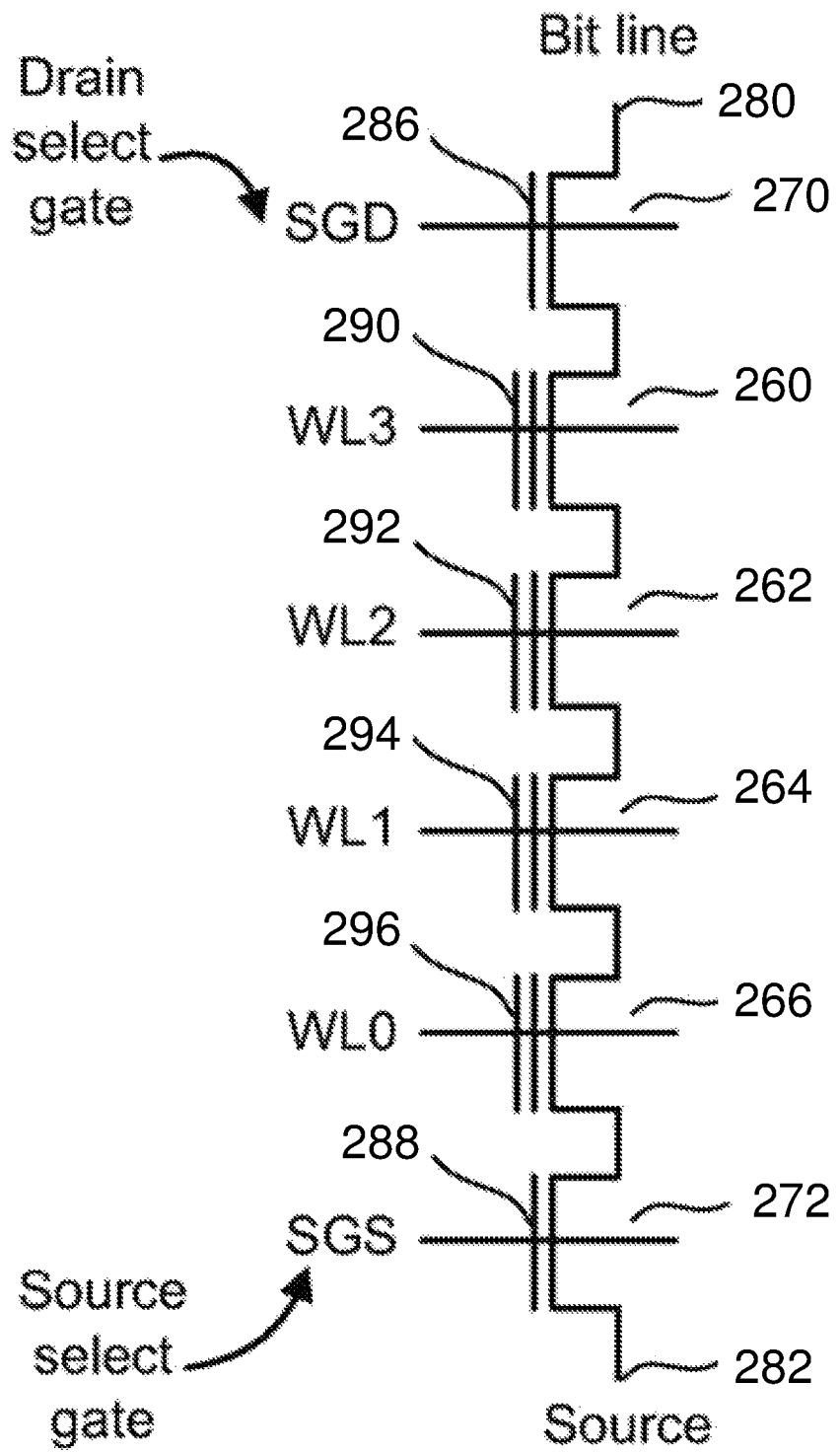
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, and 266 connected in series and located between a first select transistor 270 and a second select transistor 272. In some embodiments, a transistor 260, 262, 264, and 266 includes a control gate and a floating gate. A control gate 290, 292, 294, and 296, in one embodiment, is connected to, or comprises a portion of, a word line. In a further embodiment, a transistor 260, 262, 264, and 266 is a storage element, storage cell, or the like, also referred to as a memory cell. In some embodiments, a storage element may include multiple transistors 260, 262, 264, and 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, and 266 in the NAND string. The NAND string, in some embodiments, may include some storage elements 260, 262, 264, and 266 that have been programmed and some storage elements 260, 262, 264, and 266 that have not been programmed. As described in more detail below, the erase verify component 150 controls whether portions of a storage device, such as a NAND string, are used for memory and/or storage operations.

Figure 3:
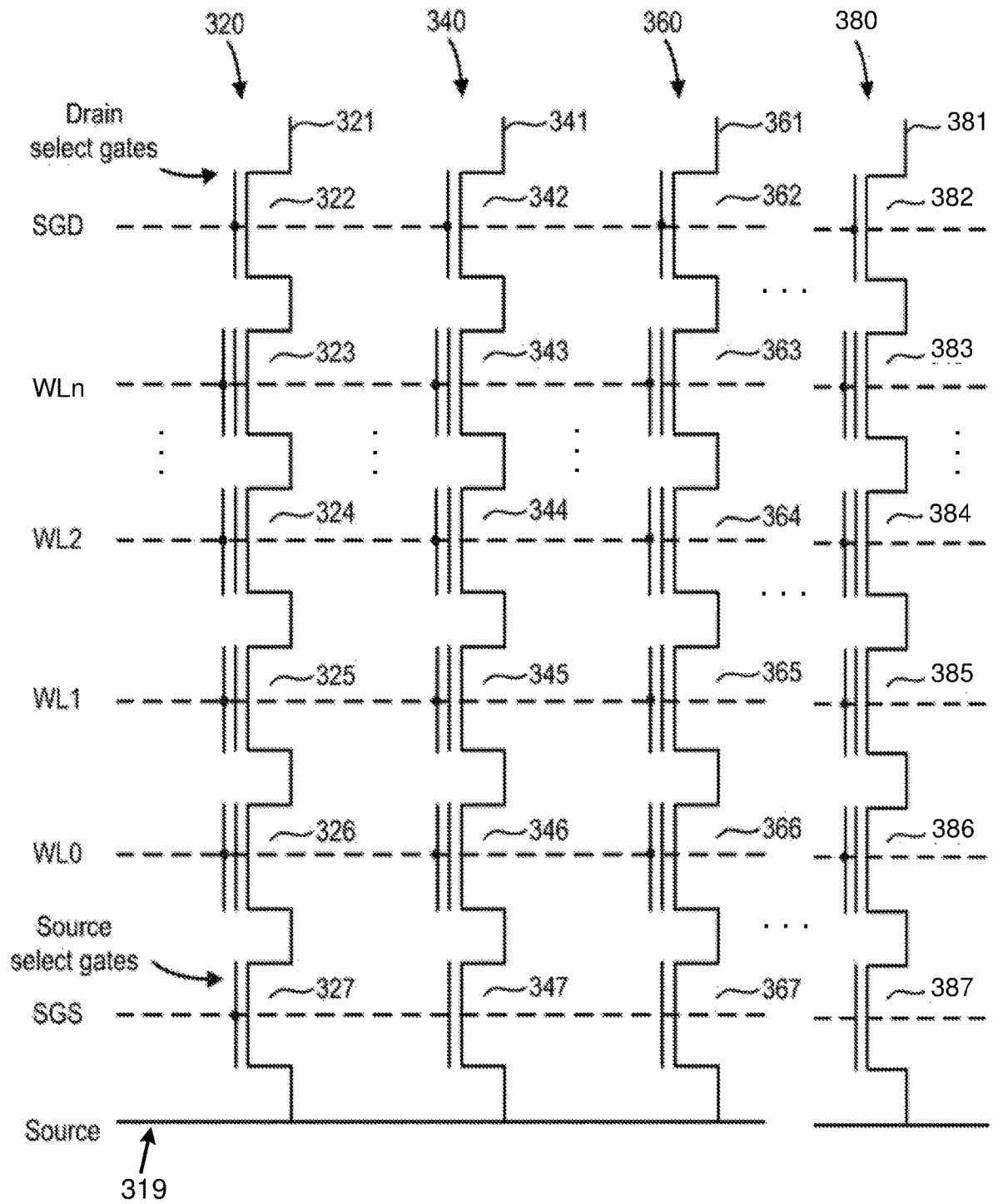
FIG. 3 is a schematic block diagram illustrating one embodiment of an array of storage cells.

FIG. 3 is a circuit diagram depicting a plurality of NAND strings 320, 340, 360, and 380. The architecture for a flash memory system using a NAND structure may include several NAND strings 320, 340, 360, and 380. For example, FIG. 3 illustrates NAND strings 320, 340, 360, and 380 in a memory array 200 that includes multiple NAND strings 320, 340, 360, and 380. In the depicted embodiment, each NAND string 320, 340, 360, and 380 includes drain select transistors 322, 342, 362, and 382, source select transistors 327, 347, 367, and 387, and storage elements 323-326, 343-346, 363-366, and 383-386. While four storage elements 323-326, 343-346, 363-366, and 383-386 per NAND string 320, 340, 360, and 380 are illustrated for simplicity, some NAND strings 320, 340, 360, and 380 can include any number of storage elements (e.g., thirty-two, sixty-four, or the like storage elements, among other storage elements that are possible and contemplated herein).

NAND strings 320, 340, 360, and 380, in one embodiment, are connected to a source line 319 by source select transistors 327, 347, 367, and 387. A selection line SGS may be used to control the source side select transistors. The various NAND strings 320, 340, 360, and 380, in one embodiment, are connected to bit lines 321, 341, 361, 381 by drain select transistors 322, 342, 362, and 382. The drain select transistors 322, 342, 362, and 382 may be controlled by a drain select line SGD. In some embodiments, the select lines do not necessarily need to be in common among the NAND strings 320, 340, 360, and 380; that is, different select lines can be provided for different NAND strings 320, 340, 360, and 380.

As described above, each word line WL0-WLn comprises one or more storage elements 323-383, 324-384, 325-385, and 326-386. In the depicted embodiment, each bit line 321, 341, 361, 381 and the respective NAND string 320, 340, 360, and 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, and 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, and 326-386.

In one embodiment, each storage element 323-326, 343-346, 363-366, and 383-386 is configured to store data. For example, when storing one bit of digital data, the range of possible threshold voltages ("VTH") of each storage element 323-326, 343-346, 363-366, and 383-386 may be divided into two ranges that are assigned logical data "1" and "0." In one example of a NAND type flash memory, the VTH may be negative after the storage elements 323-326, 343-346, 363-366, and 383-386 are erased, and defined as logic "1." In one embodiment, the VTH after a program operation is positive and defined as logic "0."

When the VTH is negative and a read is attempted, in some embodiments, storage elements 323-326, 343-346, 363-366, and 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, and 326-386 may also store multiple levels of information, for example, multiple bits of digital data. In such an embodiment, the range of VTH value is divided into the number of levels of data. For example, if four levels of information can be stored in each storage element 323-326, 343-346, 363-366, and 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, and 383-386 and the threshold voltage ranges of the storage elements 323-326, 343-346, 363-366, and 383-386 depends upon the data encoding scheme adopted for the storage elements 323-326, 343-346, 363-366, and 383-386.

In some embodiments, portions of the storage elements 323-326, 343-346, 363-366, and 383-386 may be defective. In such an embodiment, the latch assignment component 150 may manage which portions of the storage elements 323-326, 343-346, 363-366, and 383-386 are used for operations.

Figure 4:
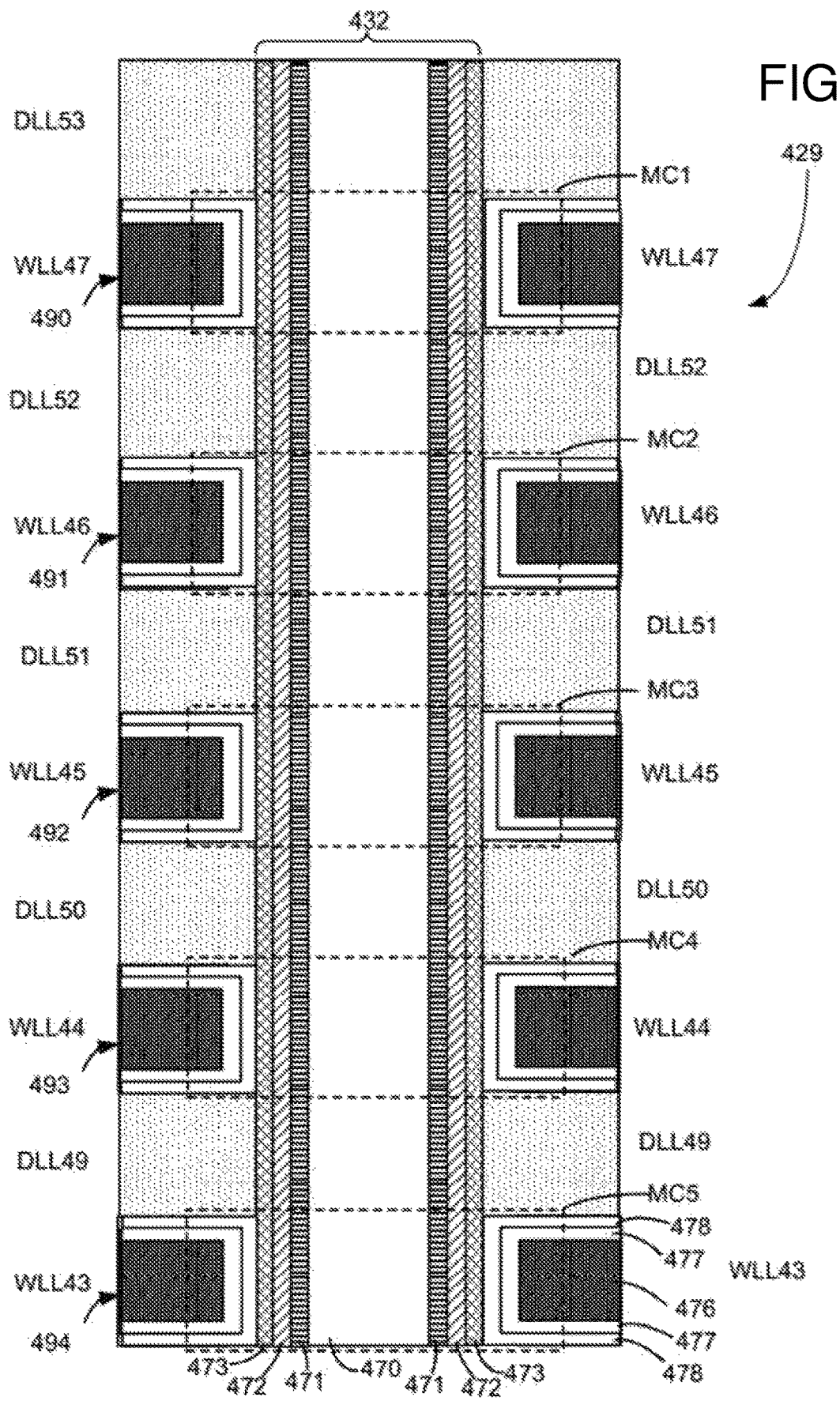
FIG. 4 is a schematic block diagram illustrating one embodiment of a three-dimensional (3D), vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge-trapping layer 473, such as (for example) Silicon Nitride. Other materials and/or structures can also be used. That is, the technology discussed herein is not limited to any particular material and/or structure.

As shown, FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge-trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge-trapping layer 473 that is associated with the memory cell. These electrons are drawn into the charge-trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge-trapping layer. During an erase operation, the electrons return to the channel or holes are injected into the charge-trapping layer to recombine with electrons. In one embodiment, erasing is achieved using hole injection into the charge-trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
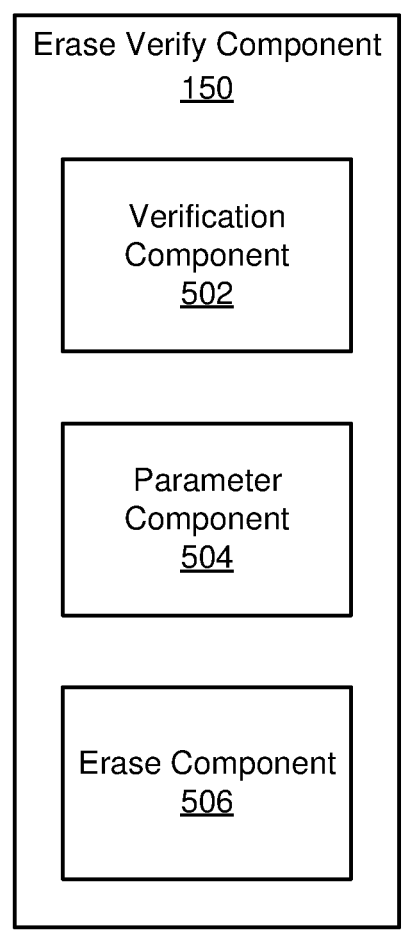
FIG. 5 is a schematic block diagram illustrating one embodiment of a erase verify component for enhanced erase retry of non-volatile storage device.

FIG. 5 is a schematic block diagram illustrating one embodiment of an erase verify component 150 for enhanced erase retry of non-volatile storage device. The erase verify component 150, in one embodiment, includes one or more of a verification component 502, a parameter component 504, and an erase component 506, which are described in more detail below.

The verification component 502, in one embodiment, is configured to detect that an erase operation that is performed on an erase block of a non-volatile memory device 120 (e.g., a 3D NAND device device) is unsuccessful, fails, does not pass, and/or the like. In one embodiment, an unsuccessful erase operation for an erase block may refer to an erase operation that fails due to select gate drain disturb caused by a drain select gate storage cell of the erase block. For example, select gate drain disturb due to program/erase cycling, temperature (e.g., low or room temperature), and/or the like may cause the threshold voltage of the select gate drain storage cells to increase beyond the point at which the verification component 502 can verify that the erase block was successfully erased because the transistors for the select gate drain storage cells do not discharge the erase block during an erase verify operation. In such an embodiment, the verification component 502 detects that the erase block is in a programmed state '0' instead of an erased state '1'.

The verification component 502, therefore, may perform one or more erase verify operations to verify that an erase operation performed on an erase block of a non-volatile storage medium 120 is successful or unsuccessful. In one embodiment, the verification component 502 returns a signal indicating whether the erase operation performed on the erase block was successful or unsuccessful. In certain embodiments, if the verification component 502 determines that the erase operation performed on the erase block is successful, then the erase block is determined to be a good block and may be used again for program operations (e.g., storing data). In some embodiments, if the verification component 502 determines that the erase operation performed on the erase block is not successful, then the erase block may be marked as a bad block, may be retired, and/or may not otherwise be reused for programming operations.

The parameter component 504, in one embodiment, is configured to adjust one or more erase parameters for the erase operation. The one or more erase parameters may be associated with one or more select gate drain storage cells on the erase block. In some embodiments, the one or more erase parameters are stored in registers, data latches, and/or other storage elements of the non-volatile storage medium 120. In one embodiment, the one or more erase parameters are settings, variables, values, data, and/or the like that affect one or more select gate drain storage cells of an erase block of the non-volatile storage medium 120. As described above, the select gate drain storage cell may a storage cell/transistor, such as transistor 270 depicted in FIG. 2, which gates or connects a NAND string to a bit line 280.

In one embodiment, the one or more erase parameters includes a voltage setting for one or more select gate drain storage cells. The voltage setting, in certain embodiments, is the gate voltage that is applied to the select gate drain storage cells. The gate voltage may be an analog voltage that is applied to the select gate drain transistors during an erase and/or erase verify operation. In some embodiments, to adjust the voltage setting, the parameter component 504 increases the voltage setting on the select gate drain storage cells, which may increase the likelihood or probability of passing an erase verify operation by allowing NAND strings to pass or discharge from the erase block, e.g., to erase the erase block and set the storage cells of the erase block to an erased state '1', even if the select gate drain storage cells have disturb issues, problems, errors, and/or the like.

In further embodiments, the one or more erase parameters include an erase bit ignore parameter. The erase bit ignore parameter, as used herein, defines an acceptable bit failure threshold for the erase block. In other words, the erase bit ignore parameter denotes the number of bit failures for an erase block that may be tolerated during an erase and/or erase verify operation of the erase block. In certain embodiments, the parameter component 504 increases the bit failure threshold for the erase bit ignore parameter so that the erase operation erases the erase block and the erase verify operation for the erase block may pass even if the select gate drain storage cells have disturb issues or errors. In some embodiments, increasing the bit failure threshold of the erase bit ignore parameter allows an erase verify operation on an erase block to pass by ignoring or allowing more bit failures for the erase block to still pass the erase verify operation criteria.

In some embodiments, the parameter component 504 adjusts one erase parameter while holding the other erase parameter constant. For example, the parameter component 504 may increase the select gate drain voltage setting while maintaining the bit failure threshold for the erase bit ignore parameter. In another example, the parameter component 504 may increase the bit failure threshold for the erase bit ignore parameter while holding the select gate drain voltage setting constant.

In some embodiments, the parameter component 504 adjusts each of the erase parameters simultaneously, together, in tandem, and/or the like. For instance, the parameter component 504 may increase both the select gate drain voltage setting and the bit failure threshold for the erase bit ignore parameter prior to executing an erase operation. In certain embodiments, the parameter component 504 adjusts the erase parameters in turn. For example, the parameter component 504 may adjust the select gate drain voltage setting for a first erase operation, while holding the erase bit ignore parameter constant. If the first erase operation fails, then the parameter component 504 may adjust the erase bit ignore parameter for a second erase operation, while holding the select gate drain voltage setting constant, and so on.

In one embodiment, the parameter component 504 adjusts each of the one or more erase parameters until a threshold setting is satisfied for each of the one or more erase parameters. For instance, the parameter component 504 may increase the select gate drain voltage setting until a threshold voltage, e.g., a maximum voltage is reached. Similarly, the parameter component 504 may increase the erase bit ignore parameter, e.g., the bit failure threshold, until a maximum number of bit failures are allowed. The parameter component 504 may set the select gate drain voltage setting and the bit failure threshold to be within an acceptable range for each of the parameters. The acceptable range may be greater than zero and less than a maximum value. At the maximum values, the voltage setting would be as high as possible, and the bit failure may be infinite such that the erase verify operation will almost always succeed for a given erase operation performed on the erase block.

In one embodiment, the erase component 506 is configured to retry the erase operation on the erase block with the one or more adjusted erase parameters, e.g., the adjusted select gate drain voltage setting and/or the bit failure threshold for the erase bit ignore parameter. In certain embodiments, the erase component 506 continuously retries the erase operation until a threshold number of erase retries is satisfied and/or until the verification component 502 verifies that the erase operation is successful. In such an embodiment, the parameter component 504 adjusts the erase parameters prior to the erase component 506 retrying each erase operation.

If the verification component 502 determines that an erase retry operation failed, and that the threshold number of erase retries is satisfied and/or that the erase parameters have reached their threshold and cannot be adjusted anymore, then the verification component 502 may mark the erase block as a bad block, may retire the erase block from being further programmed, and/or may otherwise prevent the erase block from being used for programming operations on the non-volatile storage medium 120.

In this manner, the erase verify component 150 may allow erase blocks that have some errors due to select gate drain disturb to pass an erase verify operation. In other words, borderline bad blocks may still be used for programming operations because the errors may be correctable using error-correcting code to address errors attributed to the select gate drain disturb. Therefore, because select gate drain disturb errors are correctable, the "bad" blocks, e.g., the erase blocks that have select gate drain disturb errors, can safely be used for programming operations, which may increase the lifetime of the non-volatile memory device 120.

In one embodiment, if the verification component 502 determines that the erase retry operation is successful and/or if the verification component 502 retires the erase block, the parameter component 504 resets the erase parameters that were adjusted for the erase retry operation. The parameter component 504, for instance, may reset the erase parameters to their original settings, e.g., their settings prior to being changed or modified. In certain embodiments, the parameter component 504 resets the erase parameters to predefined default settings.

Figure 6:
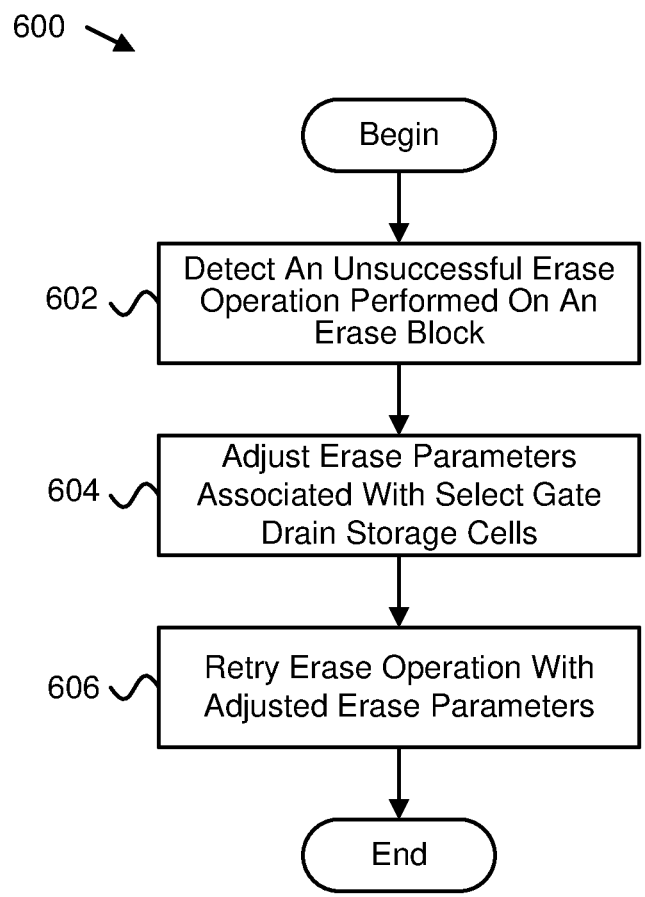
FIG. 6 is a schematic flow chart diagram illustrating one embodiment of a method for enhanced erase retry of non-volatile storage device.

FIG. 6 is a schematic flow chart diagram illustrating one embodiment of a method for enhanced erase retry of non-volatile storage device. In one embodiment, the method 600 begins, and the verification component 502 detects 602 that an erase operation that is performed on an erase block of a non-volatile storage medium 120 is unsuccessful. In further embodiments, the parameter component 504 adjusts 604 one or more erase parameters for the erase operation. The one or more erase parameters may be associated with one or more select gate drain storage cells of the erase block. In certain embodiments, the erase component 506 retries 606 the erase operation on the erase block with the one or more adjusted erase parameters, and the method 600 ends.

Figure 7:
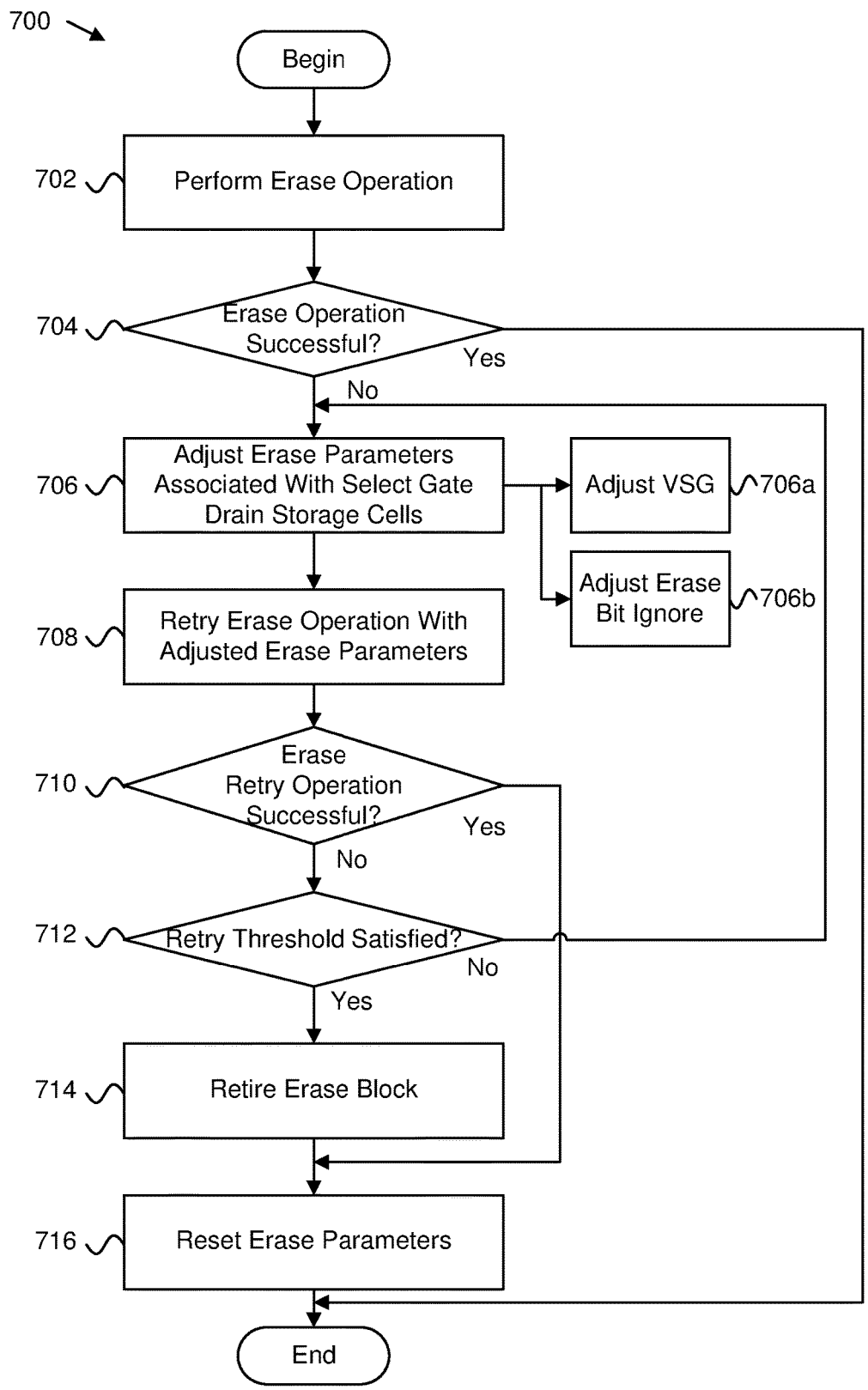
FIG. 7 is a schematic flow chart diagram illustrating one embodiment of another method for enhanced erase retry of non-volatile storage device.

FIG. 7 is a schematic flow chart diagram illustrating one embodiment of another method for enhanced erase retry of non-volatile storage device. In one embodiment, the method 700 begins and the erase component 506 performs 702 an erase operation on an erase block of a non-volatile memory device 120. In further embodiments, the verification component 502 determines 704 whether the erase operation was successful. If so, in one embodiment, the method 700 ends. Otherwise, in various embodiments, the parameter component 504 adjusts 706 one or more erase parameters that are associated with one or more select gate drain storage cells the erase block to overcome issues, problems, errors, and/or the like of the select gate drain storage cells caused by select gate drain disturb.

For instance, the parameter component 504 may adjusts 706*a* a voltage setting for the select gate drain storage cells, e.g., by increasing the threshold voltage of the select gate drain storage cells. In certain embodiments, the parameter component 504 adjusts 706*b* an erase bit ignore parameter, e.g., by increasing a failure bit threshold for the erase block. In some embodiments, the erase component 506 retries 708 the erase operation on the erase block with the one or more adjusted erase parameters.

In one embodiment, the verification component 502 determines 710 whether the erase retry operation was successful. If so, in some embodiments, the parameter component 504 resets 716 the adjusted erase parameters, e.g., the select gate drain voltage setting and/or the failure bit threshold for the erase bit ignore parameter, to their original, default, or previously set values, and the method 700 ends.

Otherwise, in one embodiment, if the verification component 502 determines 710 that the erase retry operation is not successful, then the verification component 502 determines 712 whether an erase retry threshold has been satisfied, e.g., that the number of erase retries has reached a predefined maximum threshold. If not, in certain embodiments, the parameter component 504 adjusts 706 the erase parameters again, and the erase component 506 retries the erase again with the adjusted parameters.

Otherwise, the verification component 502 retires 714 the erase block, e.g., marks the erase block as a bad erase block or otherwise prevents programming operations to be performed on the erase block. In certain embodiments, the parameter component 504 resets the adjusted erase parameters, and the method 700 ends.

Means for performing an erase operation on an erase block of a non-volatile storage medium include, in various embodiments, one or more of an erase verify component 150, an erase component 506, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for performing an erase operation on an erase block of a non-volatile storage medium.

Means for determining that the erase operation performed on the erase block failed include, in various embodiments, one or more of an erase verify component 150, a verification component 502, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for determining that the erase operation performed on the erase block failed.

Means for modifying one or more settings for the one or more select gate drain storage elements include, in various embodiments, one or more of an erase verify component 150, a parameter component 504, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for modifying one or more settings for the one or more select gate drain storage elements.

Means for retrying the erase operation on the erase block based on the one or more modified settings for the one or more select gate drain storage elements include, in various embodiments, one or more of an erase verify component 150, an erase component 506, a controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer-readable storage medium. Other embodiments may include similar or equivalent means for retrying the erase operation on the erase block based on the one or more modified settings for the one or more select gate drain storage elements.

The embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes that come within the meaning and range of equivalency of the claims are to be embraced within their scope.

What is claimed is:

1. An apparatus comprising:
a controller for a non-volatile storage device, the controller comprising:
a verification component configured to detect that an erase operation performed on an erase block of the non-volatile storage device is unsuccessful due to select gate drain disturb on one or more select gate drain storage cells of the erase block, a select gate drain storage cell comprising a storage cell that connects a string of storage cells of the erase block to a bit line of the erase block;
a parameter component configured to increase a value of one or more erase parameters for the erase operation, the one or more erase parameters comprising one or more of:
a voltage setting for the one or more select gate drain storage cells, the voltage setting comprising a gate voltage that is applied to the select gate drain storage cells during an erase operation; and
an erase bit ignore parameter, the erase bit ignore parameter defining an acceptable bit failure threshold for the erase block; and
an erase component configured to retry the erase operation on the erase block with the one or more adjusted erase parameters.

2. The apparatus of claim 1, wherein the parameter component adjusts one of the voltage setting and the erase bit ignore parameter while holding the unadjusted one of the voltage setting and the erase bit ignore parameter constant.

3. The apparatus of claim 1, wherein the parameter component adjusts both the voltage setting and the erase bit ignore parameter.

4. The apparatus of claim 1, wherein the parameter component adjusts each of the one or more erase parameters until a threshold setting is satisfied for each of the one or more erase parameters.

5. The apparatus of claim 1, wherein the erase component continuously retries the erase operation until a threshold number of retries is satisfied, the parameter component adjusting the one or more erase parameters for each erase operation retry.

6. The apparatus of claim 1, wherein the erase component continuously retries the erase operation until the verification component verifies that the erase operation is successful, the parameter component adjusting the one or more erase parameters for each erase operation retry.

7. The apparatus of claim 1, wherein the parameter component is further configured to reset the one or more erase parameters to original settings, the original settings comprising settings for the one or more erase parameters prior to the adjustment by the parameter component.

8. The apparatus of claim 1, wherein the non-volatile storage device comprises a NAND flash storage device having a plurality of three-dimensional storage cells.

9. The apparatus of claim 1, wherein at least a portion of said components comprise one or more of hardware circuits, programmable hardware devices, and executable code, the executable code stored on one or more computer readable storage media.

10. An apparatus comprising:
    means for performing an erase operation on an erase block of a non-volatile storage medium, the erase block comprising one or more select gate drain storage elements, a select gate drain storage element comprising a storage element that connects a string of storage elements of the erase block to a bit line of the erase block;
    means for determining that the erase operation performed on the erase block failed due to select gate drain disturb on the one or more select gate drain storage elements of the erase block;
    means for increasing a value of one or more settings for the one or more select gate drain storage elements, the one or more settings comprising one or more of:
        a voltage setting for the one or more select gate drain storage elements, the voltage setting comprising a gate voltage that is applied to the select gate drain storage elements during an erase verify operation; and
        an erase bit ignore parameter, the erase bit ignore parameter defining an acceptable bit failure threshold for the erase block; and
    means for retrying the erase operation on the erase block based on the one or more modified settings for the one or more select gate drain storage elements.

11. The apparatus of claim 10, wherein each of the one or more settings for the one or more select gate drain storage elements is modified until a threshold setting is satisfied for each of the one or more settings.

12. The apparatus of claim 10, further comprising means for continuously retrying the erase operation until one of a threshold number of retries is satisfied and the erase operation is verified as successful, the one or more settings for the one or more select gate drain storage elements modified for each erase operation retry.

13. The apparatus of claim 10, further comprising means for resetting the one or more settings for the one or more select gate drain storage elements to original settings, the original settings comprising values for the one or more settings for the one or more select gate drain storage elements prior to the modification.

14. A system comprising:
    a non-volatile memory device, the non-volatile memory device comprising a three-dimensional NAND flash device having a plurality of erase blocks; and
    a controller for the non-volatile memory device, the controller performing operations for:
    increasing a value of one or more parameters of select gate drain storage elements of an erase block of the non-volatile memory device in response to an erase operation failing due to select gate drain disturb on the select gate drain storage cells of the erase block, a select gate drain storage element comprising a storage element that connects a string of storage elements of the erase block to a bit line of the erase block, the one or more parameters comprising one or more of:
        a voltage setting for the one or more select gate drain storage elements, the voltage setting comprising a gate voltage that is applied to the select gate drain storage cells during an erase verify operation; and
        an erase bit ignore parameter, the erase bit ignore parameter defining an acceptable bit failure threshold for the erase block;
    retrying the erase operation on the erase block using the one or more configured parameters of the select gate drain storage elements; and
    verifying that the erase operation performed on the erase block using the one or more configured parameters of the select gate drain storage elements successfully passed.

15. The apparatus of claim 2, wherein the parameter component increases the select gate drain voltage setting while maintaining the bit failure threshold for the erase bit ignore parameter.

16. The apparatus of claim 2, wherein the parameter component increases the bit failure threshold for the erase bit ignore parameter while holding the select gate drain voltage setting constant.

17. The apparatus of claim 2, wherein the parameter component increases the one of the voltage setting and the erase bit ignore parameter that was held constant for a previous erase operation while holding constant the unadjusted one of the voltage setting and the erase bit ignore parameter for a subsequent retry of the erase operation.

18. The method of claim 10, wherein the select gate drain voltage setting is increased while the bit failure threshold for the erase bit ignore parameter is maintained.

19. The method of claim 10, wherein the bit failure threshold for the erase bit ignore parameter is increased while the select gate drain voltage setting is held constant.

20. The method of claim 10, wherein the one of the voltage setting and the erase bit ignore parameter that was held constant for a previous erase operation is increased while the unadjusted one of the voltage setting and the erase bit ignore parameter is held constant for a subsequent retry of the erase operation.

* * * * *